(12) United States Patent
Kimura et al.

(10) Patent No.: US 6,677,677 B2
(45) Date of Patent: Jan. 13, 2004

(54) SEMICONDUCTOR DEVICE

(75) Inventors: Michitaka Kimura, Tokyo (JP);
Toshihiro Iwasaki, Tokyo (JP);
Yasumichi Hatanaka, Tokyo (JP);
Keiichiro Wakamiya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/106,198

(22) Filed: Mar. 27, 2002

(65) Prior Publication Data
US 2003/0060035 A1 Mar. 27, 2003

(30) Foreign Application Priority Data

Sep. 25, 2001 (JP) .......................... 2001-292136

(51) Int. Cl.⁷ .......................... H01L 23/48; H01L 23/52
(52) U.S. Cl. .......................... 257/737; 257/778; 257/780
(58) Field of Search .......................... 257/678, 690, 257/693, 774, 778, 780, 737; 438/106, 107, 108

(56) References Cited

U.S. PATENT DOCUMENTS

| | | | | |
|---|---|---|---|---|
| 5,176,853 A | * | 1/1993 | Sarma et al. | 252/512 |
| 5,400,950 A | | 3/1995 | Myers et al. | |
| 5,602,419 A | * | 2/1997 | Takeda et al. | 257/668 |
| 5,666,008 A | * | 9/1997 | Tomita et al. | 257/678 |
| 6,265,766 B1 | * | 7/2001 | Moden | 257/678 |
| 6,273,328 B1 | * | 8/2001 | Maeda et al. | 228/254 |
| 6,329,383 B1 | * | 12/2001 | Hedgecock et al. | 514/272 |
| 6,333,561 B1 | * | 12/2001 | Chen | 257/678 |

FOREIGN PATENT DOCUMENTS

| JP | 61-224428 | 10/1986 |
|---|---|---|
| JP | 1-151182 | 6/1989 |
| JP | 1-238148 | 9/1989 |
| JP | 7-263490 | 10/1995 |
| JP | 8-102465 | 4/1996 |
| JP | 9-115910 | 5/1997 |
| JP | 2000-243785 | 9/2000 |

* cited by examiner

Primary Examiner—Michael S. Lebentritt
(74) Attorney, Agent, or Firm—McDermott, Will & Emery

(57) ABSTRACT

The semiconductor device has a flip chip structure. The chip is electrically connected to the chip mounting member via function bumps provided on the chip. Dummy bumps acting against a local bending force of the chip are interposed between the chip and the chip mounting member.

12 Claims, 7 Drawing Sheets

1　2　3

1　2　3

SEMICONDUCTOR DEVICE

FIELD OF THE INVENTION

The present invention relates to a semiconductor device having a flip chip structure that uses function bumps. Particularly, this invention relates to a semiconductor device in which a reliability of junction of the function bumps is enhanced.

BACKGROUND OF THE INVENTION

FIG. 15 shows an example of a disposition of function bumps 200 on a chip 100 of a conventional semiconductor device. As shown in FIG. 16, there is a conductor between the chip 100 and the function bump 200, and the function bump 200 is placed on a conductor 400a provided on a chip mounting member, e.g., a mounting substrate 400. Then, the conductors 100a and 400a are connected by heating and pressurizing the chip 100. An upper surface of the substrate 400 is coated with a protective film 600.

However, when ultrasonic vibration is applied to the chip 100 as in an ultrasonic thermocompression bonding method, there is an adverse possibility that the chip 100 is bent in a vertical direction by the pressurizing force. As a result, if the bumps 200 are non-uniformly distributed as shown in FIG. 15, possibility of a portion having a low-density of function bumps, for example a corner portions 120 shown by a dotted-line circle in FIG. 15, getting bent becomes large. Because of such bending, satisfactory connection at the function bumps 200 is not achieved.

SUMMARY OF THE INVENTION

It is an object of the invention to obtain a semiconductor device capable of suppressing bending of a chip to enhance the connection at the function bumps.

The semiconductor device according to the present invention has a flip chip structure. The chip is electrically connected to the chip mounting member via function bumps provided on the chip. Dummy bumps acting against a local bending force of the chip are interposed between the chip and the chip mounting member. When the chip is pressurized to the chip mounting member, the supporting member acts against the pressurizing force applied to the chip.

Other objects and features of this invention will become apparent from the following description with reference to the accompanying drawings.

DETAILED DESCRIPTIONS

Embodiments of the semiconductor device of the present invention will be explained below in detail with reference to the accompanying drawing.

Figure 1:
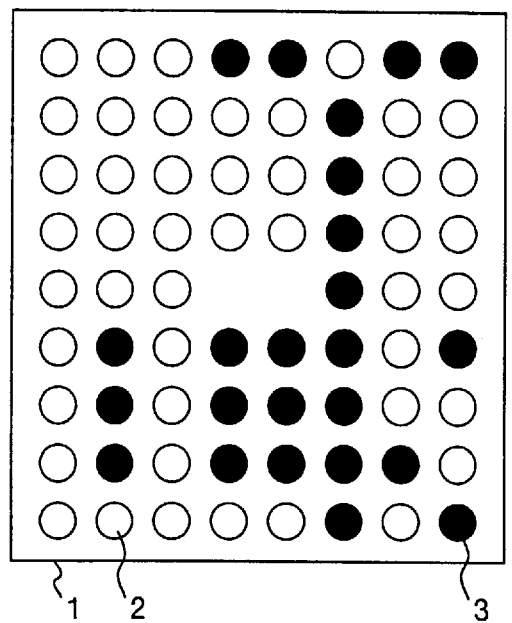
FIG. 1 is a plan view showing an example of disposition of dummy bumps of a semiconductor device according to a first embodiment of the present invention.

FIG. 1 is a plan view showing an example of layout of a dummy bump of a semiconductor device according to a first embodiment of the invention. As shown in FIG. 1, metal bumps ("function bumps 2") which are necessary for the operation of the semiconductor device with respect to the semiconductor chip 1, and bumps ("dummy bumps 3") which do not affect the operation of the semiconductor device are provided on a chip 1. The dummy bumps 3 are not used as conductors for power source, grand, or sending signals.

The function bumps 2 are not always provided at position symmetric with respect to the point of the center of the semiconductor chip 1. The dummy bumps 3 are provided at a point-symmetric vacant position of the function bump 2 which does not establish the point-symmetry.

A plurality of bumps comprising the function bumps 2 and the dummy bumps 3 are distributed symmetrically with respect to a center of the semiconductor chip 1. Therefore, even when ultrasonic vibration is applied to the semiconductor chip 1 as in an ultrasonic thermocompression bonding method, inconvenience that a portion of the semiconductor chip 1 in which the no function bump 2 exists or a portion of the semiconductor chip 1 where the distribution density of the function bumps 2 is small is largely bent locally is avoided, and the connection force of the function bump 2 is enhanced.

Figure 2:
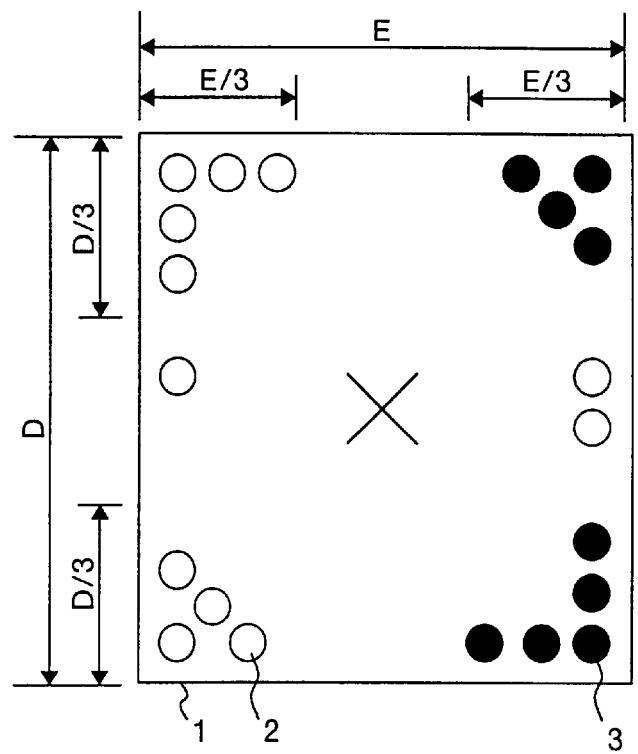
FIG. 2 is a plan view showing an example of disposition of dummy bumps of a semiconductor device according to a second embodiment of the present invention.

A second embodiment of the invention will now be explained. In the second embodiment, as shown in FIG. 2, the dummy bumps 3 are provided only at the corners of the semiconductor chip 1. That is, the dummy bump 3 is provided at a point-symmetric vacant position of a function bump 2 which does not establish the point-symmetry in the corner region of the semiconductor chip 1.

According to the second embodiment, inconvenience that one of opposed corner regions of the semiconductor chip 1 is largely bent locally is avoided, and the connection force of the function bump 2 is enhanced. Further, even when the function bump 2 exists in an inner region of the semiconductor chip 1 as shown in FIG. 1, since the disposition position of the dummy bump 3 is limited to the corner region, there is a merit that the number of dispositions of the dummy bumps 3 is reduced.

In this second embodiment, when two sides of the semiconductor chip 1 are respectively defined as side D and side E, a size of the corner region is set to (D/3)×(E/3) This size of the region may appropriately be changed in accordance with arrangement density or the like of the function bumps 2 and dummy bumps 3.

Figure 3:
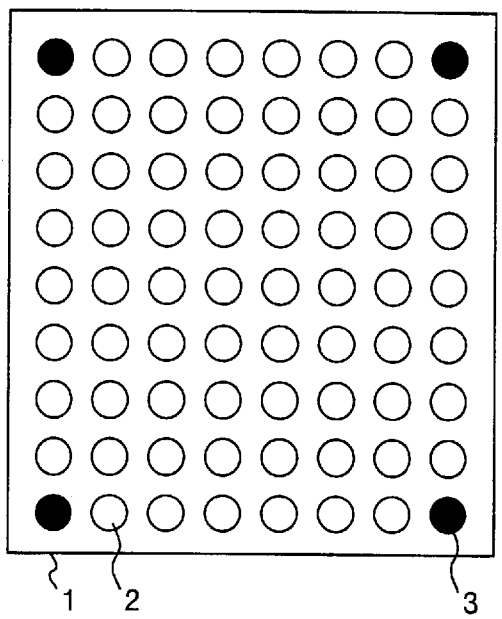
FIG. 3 is a plan view showing another example of disposition of dummy bumps of a semiconductor device according to a third embodiment of the present invention.
Figure 4:
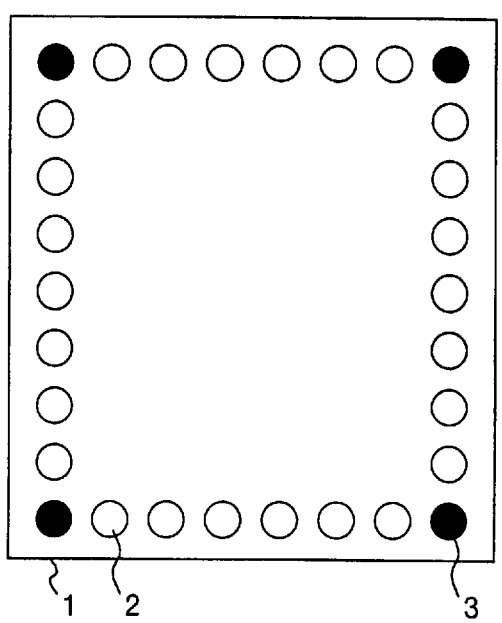
FIG. 4 is a plan view showing another example of disposition of dummy bumps of a semiconductor device according to the third embodiment of the present invention.
Figure 5:
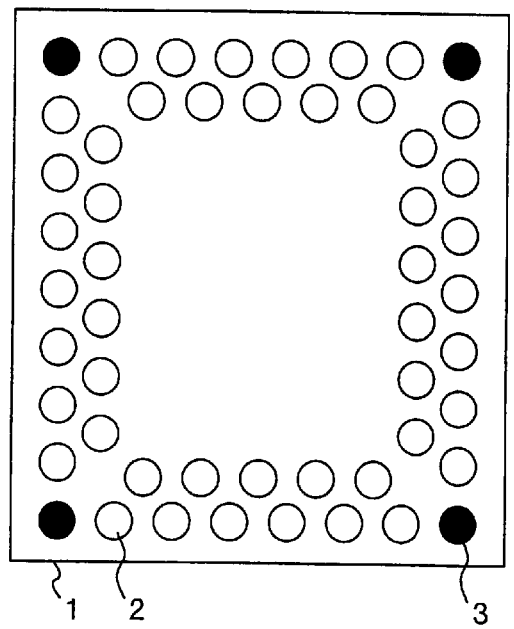
FIG. 5 is a plan view showing another example of disposition of dummy bumps of a semiconductor device according to the third embodiment of the present invention.
Figure 6:
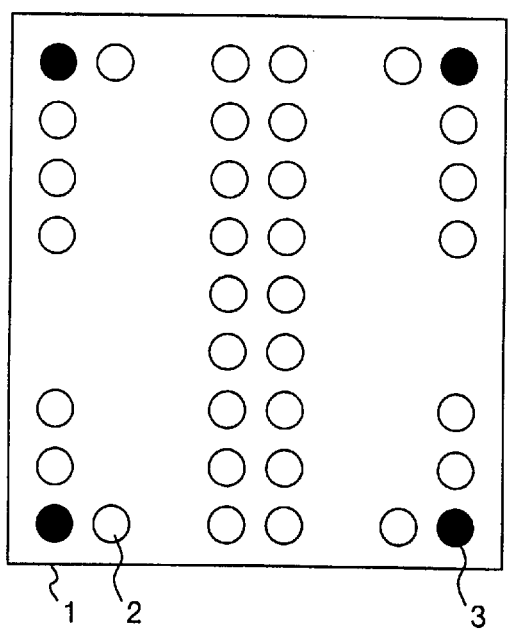
FIG. 6 is a plan view showing another example of disposition of dummy bumps of a semiconductor device according to the third embodiment of the present invention.

A third embodiment of this invention will now be explained. In the third embodiment, as shown in FIG. 3, the function bumps 2 and the dummy bumps 3 are distributed in a matrix form uniformly over the entire region of the semiconductor chip 1. Furthermore, as shown in FIG. 4 and FIG. 5, the function bumps 2 and the dummy bumps 3 are disposed on a periphery of the semiconductor chip 1. Moreover, as shown in FIG. 6, the function bumps 2 and the dummy bumps 3 are disposed on a periphery and the function bumps 2 are provided even in an inner portion of the semiconductor chip 1.

According to the third embodiment, the dummy bumps 3 are disposed at least at positions close to the corners of the semiconductor chip 1. Therefore, even if the corner portion of the semiconductor chip 1 is bent in the vertical direction, a connection failure is generated only in the dummy bump 3. That is, connection failure in the function bump 2 is avoided.

Figure 7:
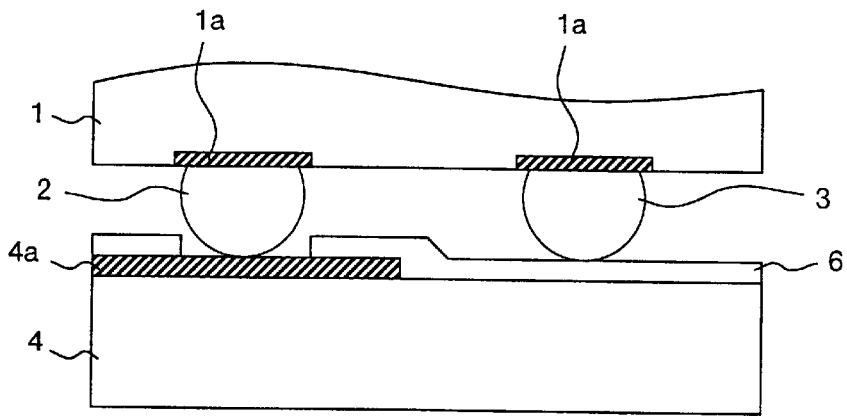
FIG. 7 is a sectional view showing a structure of a semiconductor device of a forth embodiment of the present invention.

A forth embodiment of the invention will be explained with reference to FIG. 7. In this forth embodiment, a surface of a chip mounting member 4 ("substrate" or "lower chip") on which the dummy bump 3 comes into contact is coated with an electrically insulating protective film 6 which is not metal connected to the dummy bump 3. In FIG. 7, a reference symbol 1a represents a conductor such as a pad provided on the semiconductor chip 1, and a reference symbol 4a represents a conductor such as a land provided on the chip mounting member 4.

According to the forth embodiment, a supply loss of the junction energy to the function bump 2 which becomes a problem when the dummy bump 3 is connected to a metal can be reduced.

As the insulating protective film 6, a solder resist used as a material of a protective film provided on a surface of a substrate, or polyimide coat used as a material of a protective film of a surface of the semiconductor chip 1 can be used.

Here, the function bumps 2 and the dummy bumps 3 includes bumps formed by a stud bump method, bumps formed by plating method, and bumps comprising adhesive including conductive particles.

Figure 8:
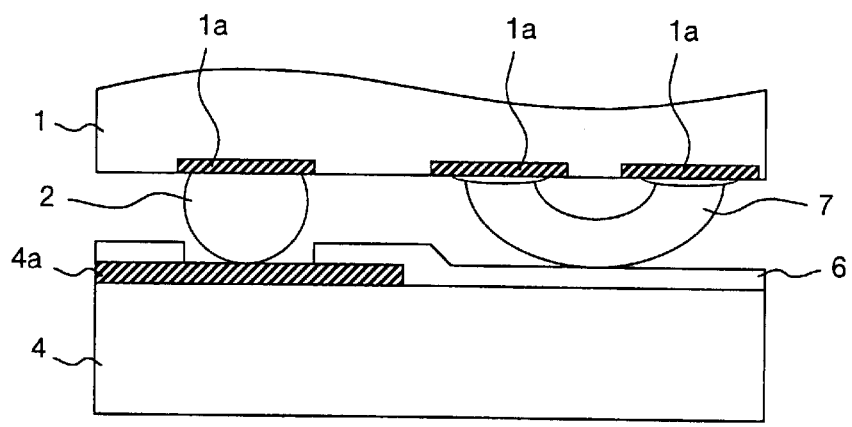
FIG. 8 is a sectional view showing a structure of a semiconductor device of a fifth embodiment of the present invention.

A fifth embodiment of the invention will be explained with reference to FIG. 8. As shown in FIG. 8, loop-like metal wires 7 are used instead of the dummy bumps 3 in any of the first to forth embodiments.

The metal wire 7 comprises a metal thin wire mainly comprising metal such as gold, copper, lead and tin, or a thin wire coated with insulating material on the surface. Opposite ends of the wire 7 are connected to the conductor 1a of the semiconductor chip 1 by means of a technique like a general wire bonding technique.

According to the fifth embodiment, since bending of the semiconductor chip 1 can be suppressed with wide area, the connection force of the function bump 2 can further be enhanced.

Figure 9:
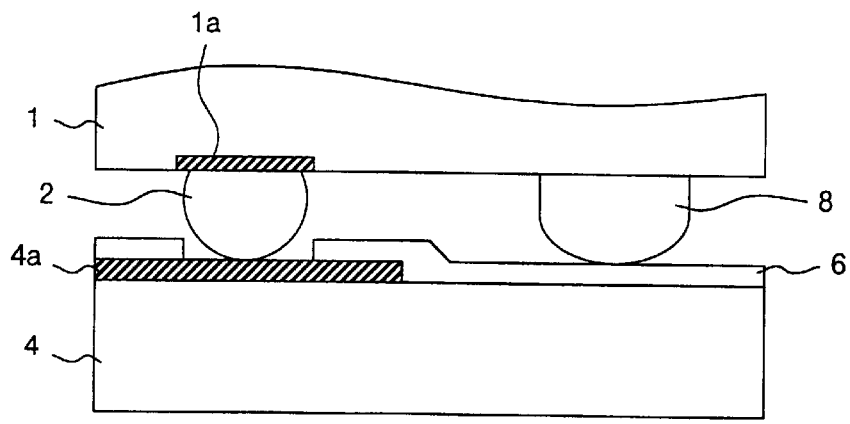
FIG. 9 is a sectional view showing a structure of a semiconductor device of a sixth embodiment of the present invention.

A sixth embodiment of the invention will be explained with reference to FIG. 9. As shown in FIG. 9, resilient projections 8 are provided instead of dummy bumps 3 in any of the first to forth embodiments. Each of the resilient projections 8 has a height which is substantially equal to a gap between the semiconductor chip 1 and the chip mounting member 4 (substrate or lower chip), and for example, provided on a surface of the semiconductor chip 1 as shown in the drawing.

Figure 10:
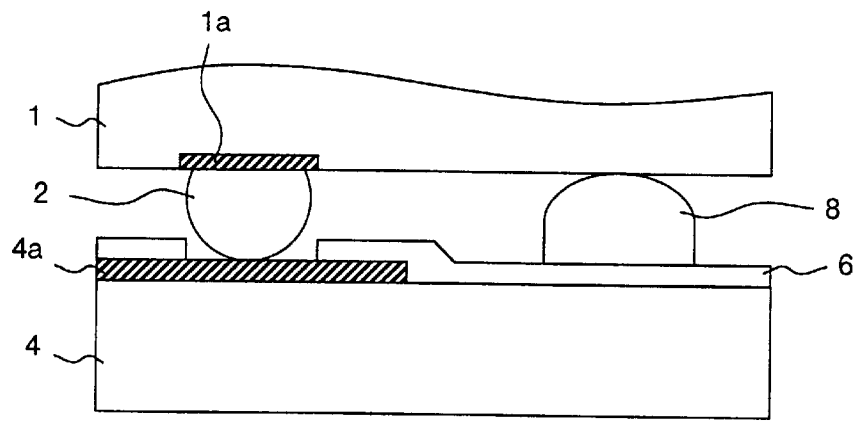
FIG. 10 is a sectional view showing a modification of a projection in the sixth embodiment.

The resilient projections 8 may be provided on a surface of the chip mounting member 4 as shown in FIG. 10.

According to the sixth embodiment, like the case in which the dummy bumps 3 are provided, an excellent connection force of the function bump 2 located at the corner of the semiconductor chip 1 can be secured.

Figure 11:
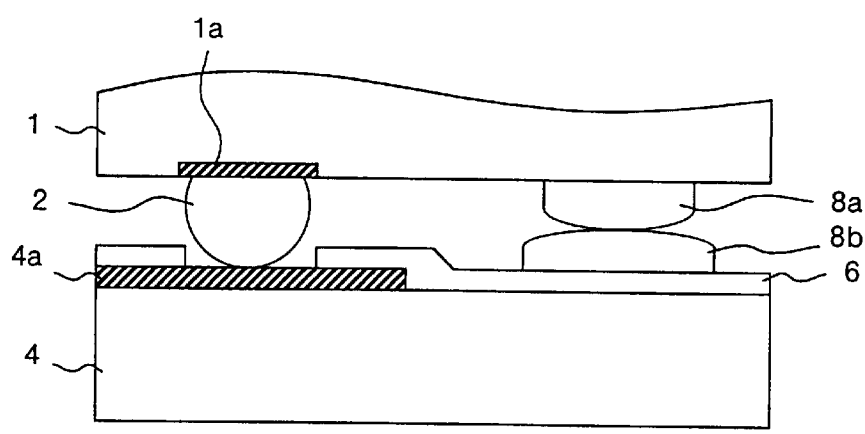
FIG. 11 is a sectional view showing another modification of the projection in the sixth embodiment.

As shown in FIG. 11, two resilient projections 8a and 8b each having about a half height of the resilient projection 8 may be provided on surfaces of the semiconductor chip 1 and the chip mounting member 4 such as to be opposed to each other, and they may be abutted against each other.

Figure 12:
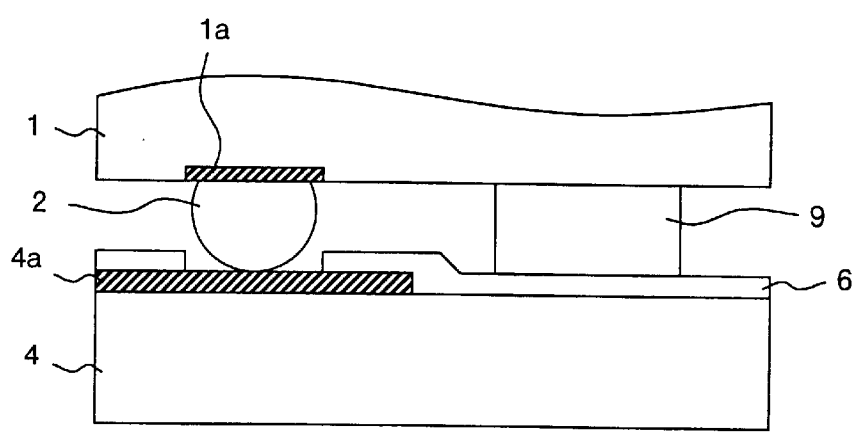
FIG. 12 is a sectional view showing a structure of a seventh embodiment of the present invention.

A seventh embodiment of the invention will be explained with reference to FIG. 12. As shown in FIG. 12, a resilient spacer 9 which is independent from the semiconductor chip 1 and the chip mounting member 4 and which has a thickness substantially equal to a gap between the semiconductor chip 1 and the chip mounting member 4 (substrate or lower chip) is interposed between the semiconductor chip 1 and the chip mounting member 4.

According to the seventh embodiment, the same connection force improving effect of the function bump 2 as that of the case in which the dummy bump 3 is used can be obtained by the resilient spacer 9 interposed between the surface of the semiconductor chip 1 and the chip mounting member 4 without adding a member having a resilient force on surfaces of the semiconductor chip 1 and the chip mounting member 4.

Figure 13:
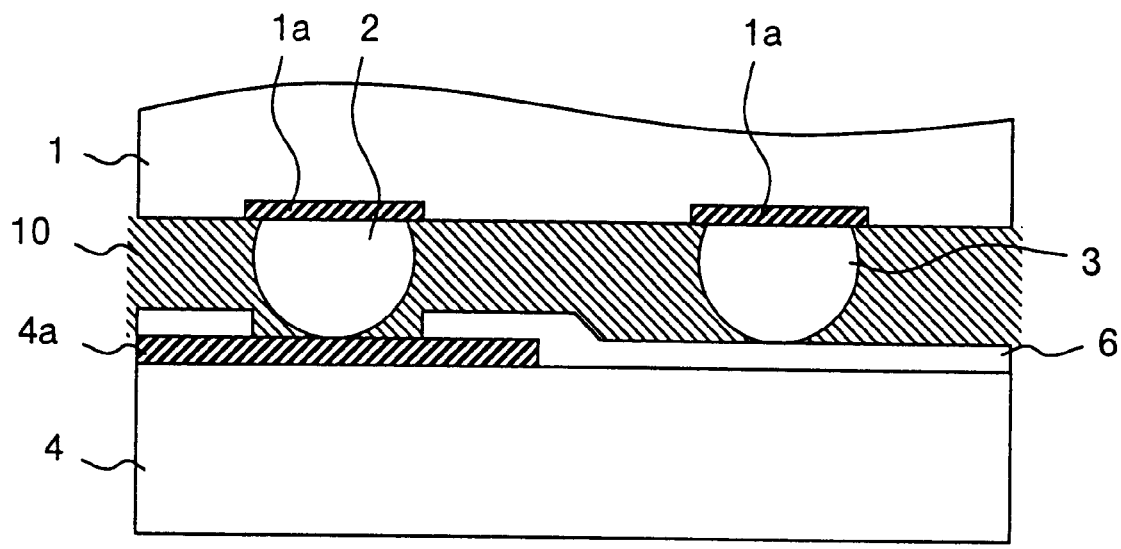
FIG. 13 is a sectional view showing a structure of an eighth embodiment of the present invention.

An eighth embodiment of the invention will be explained with reference to FIG. 13. As shown in FIG. 13, an underfill resin 10 is charged into a gap between the semiconductor chip 1 and the chip mounting member 4 (substrate or lower chip) in the first to seventh embodiments. FIG. 13 shows a state in which the underfill resin 10 is charged between the semiconductor chip 1 and the chip mounting member 4 shown in FIG. 7.

According to the eighth embodiment, there is effect that rupture of the bump joint portion caused by thermal stress received by the semiconductor device is suppressed, thereby elongating life of the bump junction section.

Figure 14:
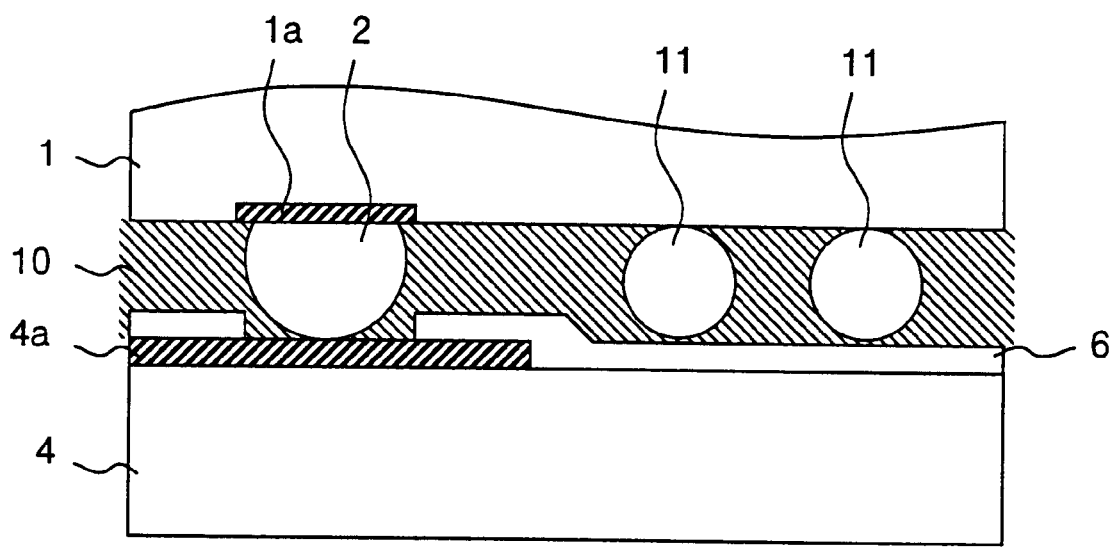
FIG. 14 is a sectional view showing a structure of a ninth embodiment of the present invention.
Figure 15:
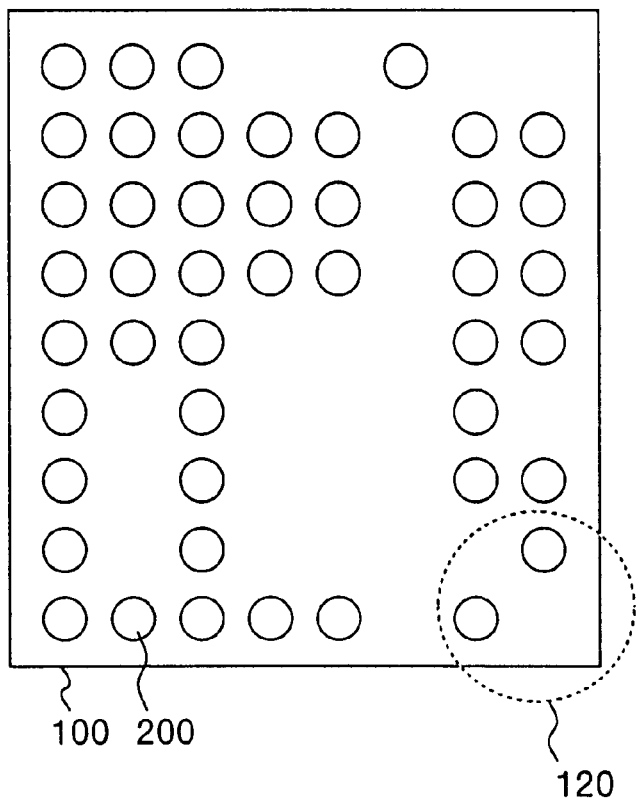
FIG. 15 is a plan view showing an example of disposition of bumps in a conventional semiconductor device.
Figure 16:
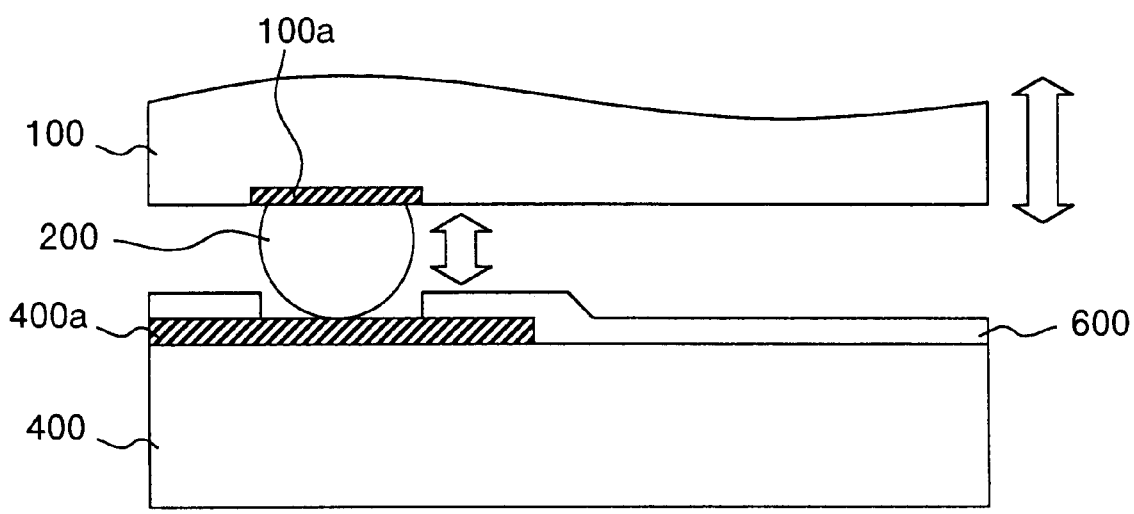
FIG. 16 is a sectional view showing an applying manner of a bending force to a chip in the conventional semiconductor device.

A ninth embodiment of the invention will be explained with reference to FIG. 14. As shown in FIG. 14, fillers 11 each having a height substantially equal to a gap between the semiconductor chip 1 and the chip mounting member 4 (substrate or lower chip) are buried in the underfill resin 10 instead of the dummy bump 3 in the above eighth embodiment.

According to the ninth embodiment, the same effect as that of the eighth embodiment using the dummy bump 3 can be obtained by the resilient fillers 11 buried in the underfill resin 10 without additional works such as forming a dummy bump 3.

As explained above, according to the present invention, when the chip for connecting the function bump to the chip mounting member is pressurized, the supporting member acts against the pressurizing force applied to the chip. Therefore, bending of the chip when ultrasonic vibration is applied can be suppressed.

Moreover, the point-symmetric vacant position of the function bump with respect to the point of the center of the chip is supported by the supporting member. Therefore, inconvenience that a portion of the semiconductor chip in which no function bump exists or a portion of the semiconductor chip where the distribution density of the function bumps is small is largely bent is avoided, and the connection force of the function bump is enhanced.

Furthermore, since the point-symmetric vacant position is limited to a predetermined corner region of the chip, there is a merit that the number of dispositions of the supporting members is reduced.

Moreover, since the chip is supported by the supporting member in the corner region of the (D/3)×(E/3) of the chip which is easily bent, the number of dispositions of the supporting members can be reduced.

Furthermore, since the bump disposition position closest to each corner of the chip is supported by the supporting member, even if bending is generated in the corner portion of the chip in the vertical direction, connection failure is generated only in the supporting member. Therefore, connection failure in the function bump can be avoided.

Moreover, since the dummy bump is used as the supporting member, the chip is supported by the dummy bump.

Furthermore, a chip mounting member surface with which the dummy bump comes into contact is coated with an electrically insulating protective film. Therefore, a supply loss of the junction energy to the function bump which becomes a problem when the dummy bump is connected to a metal can be reduced.

Moreover, the chip is supported by a loop-like metal wire, bending of the chip in the vertical direction can be suppressed with wide area.

Furthermore, the bending of the chip is suppressed by a supporting force of a resilient projection projecting from one of the chip and the chip mounting member toward the other one.

Moreover, the bending of the chip is suppressed by a supporting force of projections projecting from both the chip and the chip mounting member.

Furthermore, since a spacer which is independent from both the chip and the chip mounting member is used as the supporting member, it is unnecessary to add members having resilient forces on the surfaces of the chip and the substrate.

Moreover, an underfill resin is charged into a gap between the chip and the chip mounting member. Therefore, rupture of the bump connection section due to thermal stress received by the semiconductor device can be suppressed.

Furthermore, bending of the chip can be suppressed by a filler held by the underfill resin.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having a flip chip structure, the semiconductor device comprising:

a chip;

a chip mounting member;

a plurality of function bumps provided on said chip for electrically connecting said chip to said chip mounting member; and a supporting member interposed between said chip and said chip mounting member, wherein said supporting member acts against a local bending force of said chip, wherein said supporting member is a dummy bump provided on said chip, and said dummy bump is not electrically connected to said chip mounting member, and a region of a surface of said chip mounting member with which said dummy bumps come into contact is coated with an electrically insulating protective film.

2. A semiconductor device having a flip chip structure, the semiconductor device comprising:

a chip;

a chip mounting member;

a plurality of function bumps provided on said chip for electrically connecting said chip to said chip mounting member; and a supporting member interposed between said chip and said chip mounting member, wherein said supporting member acts against a local bending force of said chip, wherein said supporting member is disposed at a vacant position that is in point-symmetrical relation to a position of said function bump about a center of said chip.

3. The semiconductor device according to claim 2, wherein said point-symmetric vacant position is limited to a predetermined corner region of said chip.

4. The semiconductor device according to claim 3, wherein a size of said corner region is (D/3)×(E/3), where D and E are lengths of the sides of said semiconductor device.

5. The semiconductor device according to claim 2, wherein said supporting member is disposed at a portion of a predetermined bump position set on said chip closest to each corner.

6. The semiconductor device according to claim 2, wherein said supporting member is a dummy bump provided on said chip, wherein said dummy bump is not electrically connected to said chip mounting member.

7. A semiconductor device having a flip chip structure, the semiconductor device comprising:

a chip;

a chip mounting member;

a plurality of function bumps provided on said chip for electrically connecting said chip to said chip mounting member; and a supporting member interposed between said chip and said chip mounting member, wherein said supporting member acts against a local bending force of said chip, wherein said supporting member is a metal wire projecting from said chip into a projecting direction of said function bumps in a form of a loop.

8. The semiconductor device according to claim 2, wherein said supporting member is a resilient projection projecting from one of said chip and said chip mounting member toward the other one.

9. The semiconductor device according to claim 2, wherein said supporting member is a set of resilient projections respectively projecting from said chip and said chip mounting member toward each other.

10. The semiconductor device according to claim 2, wherein said supporting member is a resilient spacer independent from both said chip and chip mounting member.

11. The semiconductor device according to claim 2, wherein an underfill resin is filled into a gap between said chip and said chip mounting member.

12. The semiconductor device according to claim 2, wherein said supporting member is a resilient filler, and an underfill resin is filled into a gap between said chip and said chip mounting member such that said filler is buried in said underfill resin.

* * * * *